(12) United States Patent
Seyedi et al.

(10) Patent No.: US 10,845,544 B1
(45) Date of Patent: Nov. 24, 2020

(54) OPTICAL SOURCE TESTING

(71) Applicant: HEWLETT PACKARD ENTERPRISE DEVELOPMENT LP, Houston, TX (US)

(72) Inventors: Ashkan Seyedi, Palo Alto, CA (US); Antoine Descos, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/601,907

(22) Filed: Oct. 15, 2019

(51) Int. Cl.
G02B 6/293 (2006.01)
H01S 5/06 (2006.01)
H01S 5/026 (2006.01)

(52) U.S. Cl.
CPC ........ G02B 6/29395 (2013.01); H01S 5/0607 (2013.01); H01S 5/0261 (2013.01)

(58) Field of Classification Search
CPC .. G02B 6/29395; H01S 5/0607; H01S 5/0261
USPC .......................................................... 385/88
See application file for complete search history.

(56) References Cited

U.S. PATENT DOCUMENTS

| | | |
|---|---|---|
| 16,023,596 | 6/2018 | Seyedi et al. |
| 16,399,176 | 4/2019 | Van Vaerenbergh et al. |
| 15,946,807 | 10/2019 | Seyedi et al. |
| 2010/0260496 A1* | 10/2010 | Tosetti ................ H04J 14/0282 398/7 |
| 2012/0057866 A1* | 3/2012 | McLaren ........... G02B 6/12007 398/25 |
| 2013/0156052 A1* | 6/2013 | Diehl .................... H01S 5/0612 372/20 |
| 2013/0161496 A1* | 6/2013 | Akiyama ............ H04J 14/0212 250/227.23 |
| 2016/0036550 A1* | 2/2016 | Welch ................ H04J 14/0221 14/221 |
| 2017/0261692 A1* | 9/2017 | Knights ................. G02F 1/025 |
| 2018/0102627 A1* | 4/2018 | Parker ................ G02B 6/29395 |
| 2018/0212682 A1* | 7/2018 | Chen ................ H04B 10/25755 |

\* cited by examiner

*Primary Examiner* — Jerry M Blevins
(74) *Attorney, Agent, or Firm* — Hewlett Packard Enterprise Patent Department

(57) ABSTRACT

Examples herein relate to optical systems. In particular, implementations herein relate to an optical system including a bidirectional optical link such as an optical fiber. The optical system includes a resonator tuned to filter a resonant wavelength of light emitted by an optical source. The optical source may be configured to emit light having multiple wavelengths, and the resonator may be configured to receive light emitted by the optical source. The optical system may further include a photodetector to receive the resonant wavelength and measure a power of the resonant wavelength. The optical system may further include a controller coupled to the optical source. The controller may receive the measured first power of the resonant wavelength and change the state of the optical source when the measured power of the resonant wavelength is outside a per-wavelength threshold range.

18 Claims, 5 Drawing Sheets

OPTICAL SOURCE TESTING

BACKGROUND

The term "laser" is an acronym for light amplification by stimulated emission of radiation. Laser light may be generated when the electrons of atoms in certain materials (e.g., crystals, gases, or glasses) absorb energy from an energy source (e.g., an electrical current or another laser). As a result of this energy absorption, the electrons move from a ground state into an excited state. When the electrons return to the ground state, the electrons emit photons of relatively discrete wavelengths.

In fiber optics, laser light can be used as a medium for signal transmission. Fiber optic cables provide high bandwidth, low power loss, resistance to electromagnetic interference, and other qualities that are useful for a wide variety of applications.

BRIEF DESCRIPTION OF THE DRAWINGS

Certain examples are described in the following detailed description and in reference to the drawings, in which.

DETAILED DESCRIPTION OF SPECIFIC EXAMPLES

The present disclosure describes examples for health checking a multi-wavelength optical source. The optical source may be a laser in some examples. The laser may comprise a laser diode for generating laser light. The laser may further comprise a comb laser (e.g., a quantum dot based diode laser operating as an optical frequency comb generator that generates a low-noise multi-spectral output of approximately equidistant spectral lines). In some examples, the laser may include multiple laser diodes configured to generate laser light of different spectral bandwidths.

To determine the health state of the multi-wavelength optical source, both a total power of the optical source output and a per-wavelength power of the optical source output may be measured. In some examples, an optical source may be properly functioning or otherwise properly biased when the total power of the optical source is above a threshold power, or otherwise within a predetermined power range, and when the power of each wavelength of light emitted by the optical source is above a per-wavelength threshold power, or otherwise within a predetermined per-wavelength power range. In some example implementations, the threshold power for each wavelength may be the same or of different predetermined threshold values.

An optical source may be considered "unhealthy," improperly biased, and/or otherwise improperly calibrated when the total power of the optical source is below the threshold power or otherwise outside the predetermined power range, and/or when the power of each wavelength of light emitted by the optical source is below a specific wavelength threshold, or otherwise outside a specific wavelength threshold range. In some example implementations, an optical source is considered "unhealthy" when a predetermined number of wavelengths of light are below respective specific wavelength thresholds, and/or when specific predetermined wavelengths of light are below respective specific wavelength thresholds.

Figure 1:
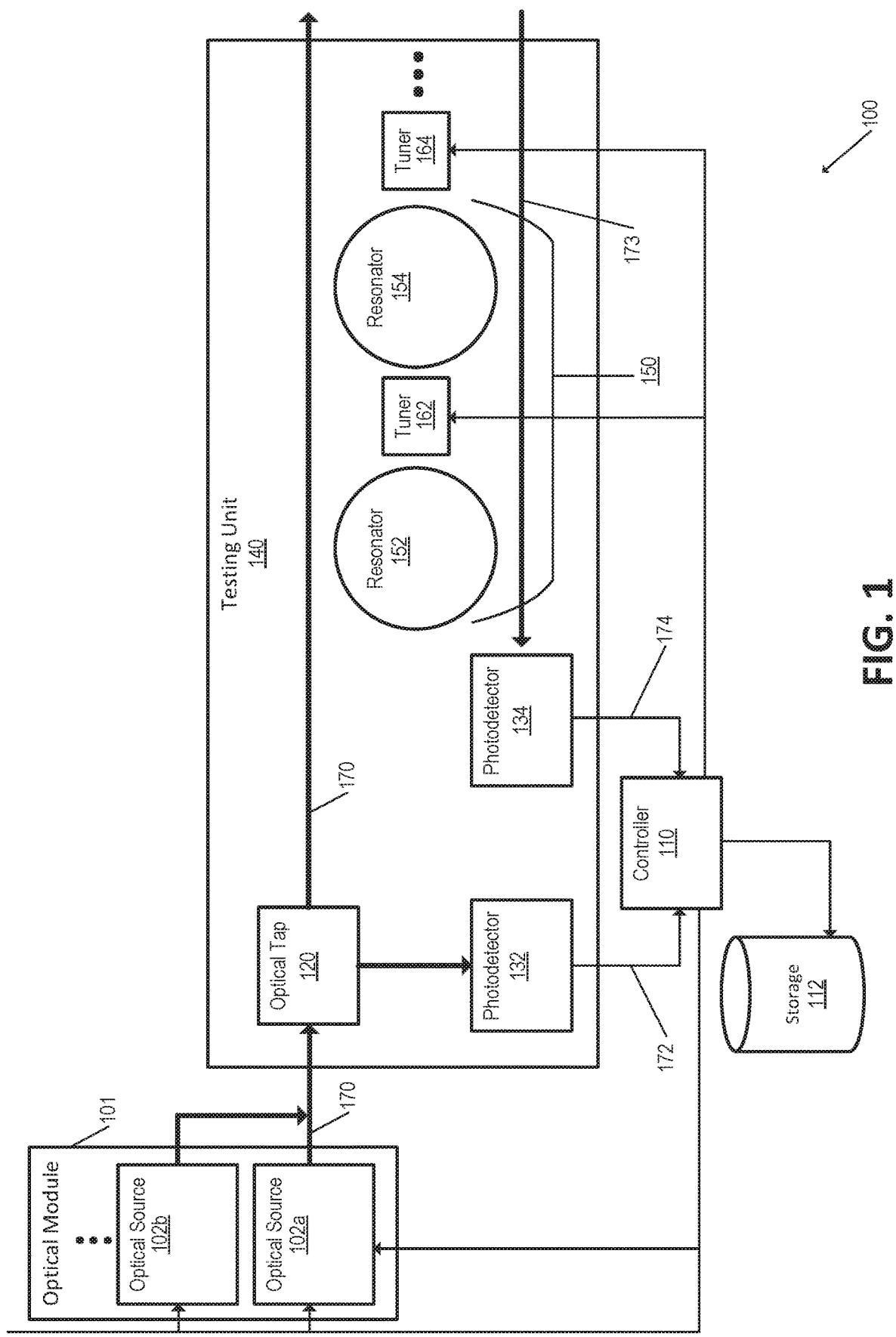
FIG. 1 is a block diagram illustrating an example system for optical source testing.

FIG. 1 is a block diagram illustrating an example system 100 for optical source testing. Optical module 101, as further described herein, may include any number of optical sources, however two such example optical sources, optical source 102a and optical source 102b respectively, are referred to herein for purposes of clarity and conciseness. A reference to optical source 102 herein is a reference to any of optical source 102a, optical source 102b, or any other optical source of optical module 101 not otherwise illustrated. Optical source 102 can be disposed off-chip (e.g., coupled onto the chip via an optical fiber) or on-chip (e.g., formed on or integrated within the chip) of optical module 101. For example, optical source 102 may be a comb laser (e.g., an external comb laser) configured to generate a plurality of different laser or comb lines or wavelengths from a single module and is optically coupled to respective testing unit 140. Specifically, optical module 101 may include any number of comb lasers that generate laser light (e.g., carrier waves) of different spectral bandwidths as output.

Optical source 102a and/or optical source 102b may be activated or inactivated, such that optical source 102a and optical source 102b do not generate the laser light output when in the inactive state. In an example implementation, optical source 102b may be a redundant optical source such that optical source 102a may be inactivated and optical source 102b activated when optical source 102a is determined to be unhealthy, or otherwise misconfigured.

Testing unit 140 may include various components for determining the state, e.g. health state, configuration state, etc., of optical source 102. Specifically, testing unit 140 may include circuitry with any number of components as described herein configured to filter and measure an optical output received by optical source 102. Testing unit 140, in some example implementations as further described herein, may determine the state of optical source 102 by measuring the optical output power of optical source 102. In an example implementation, testing unit 140 may receive the optical output of optical source 102 via waveguide 170 coupled to optical source 102 and to testing unit 140. In an example, waveguide 170 may be a bus waveguide.

In an example implementation, optical source 102 may be coupled to testing unit 140 via a flip-chip process. For example, optical source 102 may be integrated on an integrated circuit (IC) or substrate and, via flip-chip packing, may be coupled to testing unit 140, which may be integrated on a second IC or substrate. In other example implementations, optical source 102 may be an off-chip laser source, and may otherwise be coupled to testing unit 140 via waveguide 170.

Testing unit 140 may include photodetectors 132 and 134 for measuring quantities associated with the laser light emitted from optical source 102. For example, photodetectors 132 and/or 134 may include a photodiode configured to measure the optical output power of optical source 102. Testing unit 140 may further include an optical tap 120 to, receive light emitted from optical source 102 via waveguide 170, and extract at least a portion of the light emitted by the optical source. In an example implementation, optical tap 120 may extract 1%-10% of the total light emitted by the optical source. In an example, optical tap 120 may redirect the extracted light to photodetector 132.

Photodetector 132 may receive the light extracted by optical tap 120 and measure a total power of the light emitted by optical source 102. The total power of the light emitted by optical source 102 may be a summation of the per-wavelength power of each wavelength of light emitted by optical source 102. In an example implementation, photodetector 132 may be configured to communicate readings to controller 110, e.g., via circuit path 172.

In addition to measuring a total power of the light emitted by optical module 101, testing unit 140 may include components for measuring a per-wavelength power of the light emitted by optical module 101. For example, testing unit 140 may include at least one set of two or more resonators 150, each resonator to isolate a wavelength of light of the light emitted by optical module 101. For purposes of clarity and conciseness, two example resonators of the set of resonators 150 are illustrated, resonator 152 and resonator 154 respectively, however set of resonators 150 may include any number of resonators. Each resonator may be an optical ring resonator, cavity resonator, microdisk, or other suitable traveling wave resonator for isolating a wavelength of light.

Each resonator of the set of resonators 150 can be tuned to a different resonant wavelength corresponding to a different channel or wavelength of the multiple wavelengths emitted from optical module 101. In an example implementation, each of the set of resonators 150 may be tuned by a respective tuner, e.g. tuner 162 and tuner 164, to a single wavelength of the emitted light different from the other resonators. For example, either of tuners 162 or 164 may be a micro-heater, and tuning may be accomplished via thermal tuning, bias-tuning, or a combination of both. In other example implementations, either of tuners 162 or 164 may be an injection diode, or a metal-oxide-semiconductor (MOS) capacitor.

In other example implementations, any of resonators may be pre-tuned to a resonant wavelength corresponding to a wavelength of the multiple wavelengths emitted from optical module 101 upon manufacturing. For example, resonance properties of each resonator can be precisely tuned to a different resonant wavelength by varying the radius of each ring or by tuning the cladding index.

Set of resonators 150 may be coupled (e.g., via evanescent coupling) to waveguides 170 and 173. Specifically, a resonator of set of resonators 150 may receive light as input via waveguide 170 and output light via waveguide 173. Set of resonators 150 may be ring resonators, such that when light of the appropriate wavelength is coupled from waveguide 170 to a corresponding resonator of the set of resonators 150, constructive interference causes a buildup in intensity over multiple round-trips through the resonator. Thereafter, light of the resonant wavelength may propagate across waveguide 173 in the opposite direction to waveguide 170. Accordingly, each of the set of resonators 150 may act as filters to isolate a specific wavelength of a multi-wavelength optical signal received via waveguide 170.

In this example, only one output waveguide 173 and per-wavelength photodetector 134 is illustrated for purposes of clarity and conciseness. However, in some example implementations, each resonator of set of resonators 150 may be coupled to a different output waveguide. Each of the different output waveguides may carry a respective wavelength to a different photodetector. For example, when each resonator of set of resonators 150 is pre-tuned to a different resonant wavelength, each resonator may also be coupled to a different output waveguide to carry each resonant wavelength respectively, and a photodetector may be coupled to each of the different output waveguides to receive light of a respective wavelength. In other example implementations, a single resonator may be implemented and tuned sequentially such that the resonator may isolate each wavelength of light emitted by optical module 101 to be measured by photodetector 134.

Photodetector 134 may receive light from output waveguide 173 and may measure the power of any optical signal received. Because waveguide 173 is configured to carry a wavelength of light isolated by a resonator of the set of resonators 150, photodetector 134 may measure a per-wavelength power of the optical signal, in contrast to the total power of emitted light measured by photodetector 132. In an example implementation, photodetector 134 may be configured to communicate readings to controller 110, e.g., via circuit path 174.

In an example implementation, controller 110 is electronically coupled to each of photodetectors 132 and 134, and to any of tuners 162 and 164. Controller 110 allows monitoring of the output optical control signal traversing main bus waveguide 170, and may control the status and/or configuration of optical source 102. Controller 110 may be communicatively and operably coupled to optical module 101, and specifically to optical sources 102 of optical module 101, with control logic configured (e.g., programmable and executable) to tune at least one of the optical sources 102 of optical module 101 such that a desired, pre-selected, or pre-determined output total power threshold and/or an output per-wavelength power threshold is maintained.

Controller 110 may be implemented by one or more engines which may be any combination of hardware and programming to implement the functionalities of the engine(s). In examples described herein, such combinations of hardware and programming may be implemented in a number of different ways. For example, the programming for the engines may be processor executable instructions stored on at least one non-transitory computer readable storage medium and the hardware for the engines may include at least one processing resource to execute those instructions. In some examples, the hardware may also include other electronic circuitry to at least partially implement at least one of the engine(s). In some examples, the at least one computer readable medium may store instructions that, when executed by the at least one processing resource, at least partially implement some or all of the engine(s). In such examples, a computing device may include the at least one computer readable storage medium storing the instructions and the at least one processing resource to execute the instructions. In other examples, the engine may be implemented by electronic circuitry.

Controller 110, as further described herein, may be electronically coupled to photodetectors 132 and/or 134 such that controller 110 may receive any measurements of photodetectors 132 and/or 134. Specifically, controller 110 may receive a measured total optical power emitted by optical module 101 as measured by photodetector 132, and/or a measured per-wavelength optical power as measured by photodetector 134. In an example implementation, controller 110 may store any received measurements in memory at storage 112.

Controller 110 may determine whether the measured total optical power is below and/or above a total power threshold, and may change a state of optical source 102 responsive to a positive determination. Similarly, controller 110 may determine whether the measured per-wavelength optical power is below and/or above a per-wavelength threshold, and may change the state of optical source 102 when the measured per-wavelength power is outside the threshold range. In an example implementation, controller 110 may change the state of optical source 102 when a predetermined number of wavelengths emitted by optical source 102 are below a per-wavelength threshold, or when any combination of specific wavelengths emitted by optical source 102 are below a per-wavelength threshold.

Controller 110 may change the state of optical source 102 such that a desired, pre-selected, or pre-determined output total power threshold and/or an output per-wavelength power threshold is maintained. In an example implementation, controller 110 may change the state of optical source 102 by increasing the bias of optical source 102. In other words, controller 110 may increase a total power of light emitted by the optical source. Increasing the bias of optical source 102 may likewise increase the per-wavelength power of each respective wavelength emitted by optical source 102. In an example implementation, the bias may be increased by predetermined intervals responsive to a determination that the total power of light, and/or the per-wavelength power of light is below a threshold.

In an example implementation, controller 110 may change the state of optical source 102 by inactivating an "unhealthy" active optical source, and activating a "healthy" redundant optical source. For example, optical source 102a may be in an active state and optical source 102b may be in an inactive state such that optical source 102a, and not optical source 102b, may be emitting a multi-wavelength optical signal across waveguide 170. Controller 110 may inactivate optical source 102a and activate backup optical source 102b responsive to a determination that a total power of light emitted by optical source 102a is below a threshold, and/or a per-wavelength power of light emitted by optical source 102a is below a threshold. In an example implementation, controller 110 may activate optical source 102b and/or inactivate optical source 102a when it is determined that both (1) the total power of light emitted by optical source 102a is below a total power threshold, and/or a per-wavelength power of light emitted by optical source 102a is below a per-wavelength threshold, and (2) the bias of optical source 102a is above a bias threshold. Thus, controller 110 may raise the bias of optical source 102a when a total or per-wavelength power is below a threshold, and beyond a given bias increase, may deactivate "unhealthy" optical source 102a in favor of a "healthy" optical source.

In an example implementation, controller 110 may change the state of optical source 102 by adjusting the gain medium (i.e. total power and/or per-wavelength power), saturable absorber (total noise and/or per-wavelength noise), modulation (spacing between wavelengths), and/or other parameters for changing the total power and/or per-wavelength power output of optical source 102, and/or any combination thereof. In an example, controller 110 may adjust the state of optical source 102 to discrete desired, pre-selected, or pre-determined parameter values for generating an output spectrum. For instance, optical source 102a may be set to a first state having a set current bias 400 mA, a reverse voltage bias of −7V, and a radio frequency modulation of 25 GHz. Controller 110, responsive to a determination that an output total power or per-wavelength power is below a threshold or otherwise outside a threshold range, may change optical source 102a to a second state having a set current bias of 500 mA, a reverse voltage bias of −6V, and a radio frequency modulation of 25 GHz. As another illustrated example, controller 110 may change the state of optical source 102a to a third state of inactivation, and may otherwise activate redundant optical source 102b where the output total power or per-wavelength power is determined to be below a threshold at the second state.

Controller 110 may further control the tuning frequency of the set of resonators 150 via example tuners 162 and 164. Controller may, for example, tune resonator 152 to a first resonant wavelength of the multiple wavelengths of light emitted by optical module 101, collect a per-wavelength measurement of the first wavelength and otherwise store the measurement at storage 112, and tune resonator 152 thereafter to a second resonant wavelength of the multiple wavelengths of light emitted by optical module 101 for measurement. In another example, controller 110 may concurrently tune resonator 152 via tuner 162 to the first resonant wavelength, and resonator 154 to the second resonant wavelength for measurement.

Figure 2:
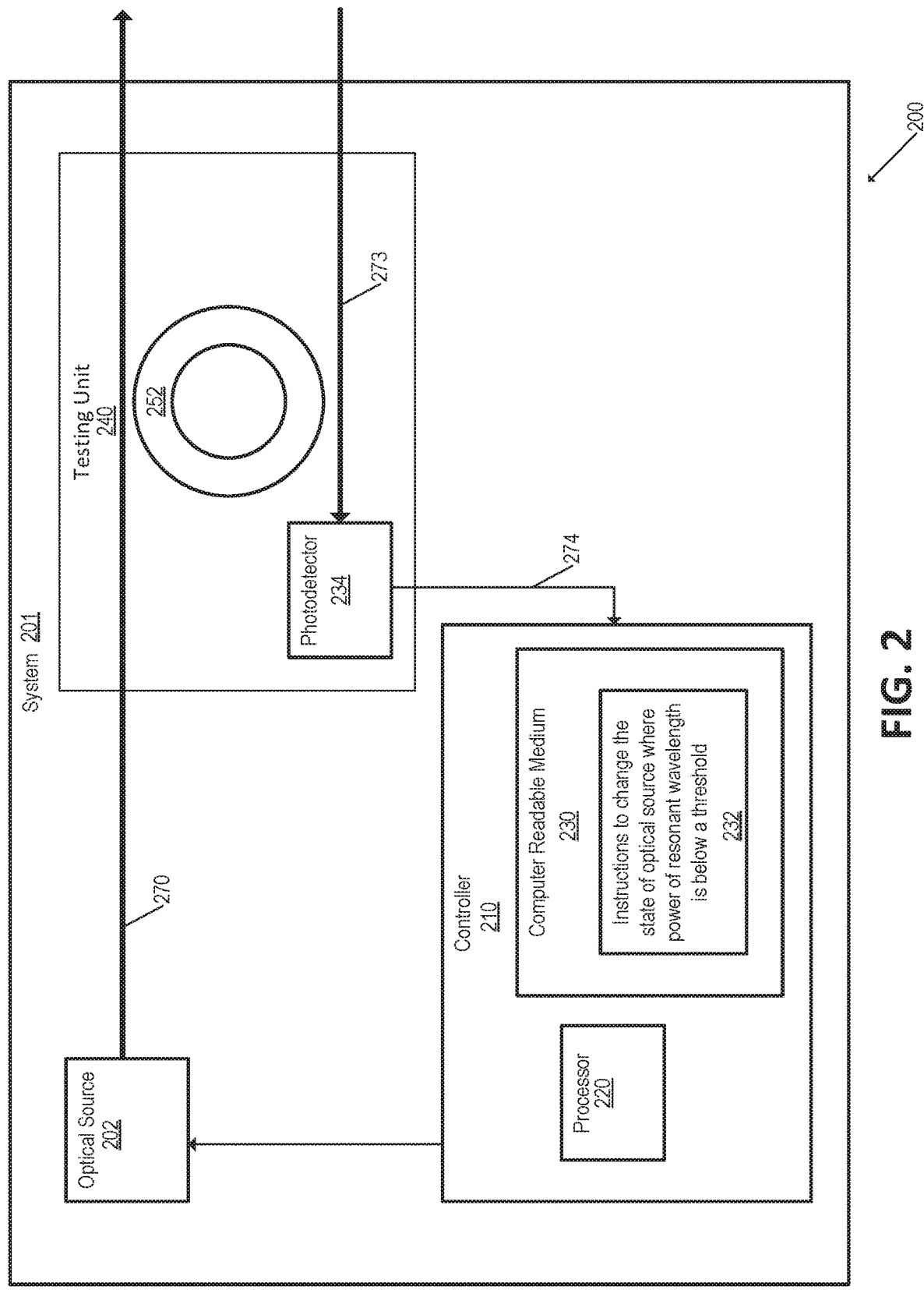
FIG. 2 is a block diagram illustrating another example system for optical source testing.

FIG. 2 is a block diagram 200 illustrating a system 201 for optical source testing. System 201 may include components integrated on a single integrated circuit, or across multiple integrated circuits in optical and/or electrical communication. Similar to optical source 102 as described above, optical source 202 can be disposed off-chip (e.g., coupled onto the chip via an optical fiber) or on-chip (e.g., formed on or integrated within the chip) of optical module 101. Optical source 202 may be a comb laser (e.g., an external comb laser) configured to generate a plurality of different laser or comb lines or wavelengths from a single module and is optically coupled to respective testing unit 240. Specifically, optical source 202 may include any number of comb laser that generate laser light (e.g., carrier waves) of different spectral bandwidths as output.

In an example implementation, system 201 may include flip-chip packaged components. For example, optical source 102 may be coupled to testing unit 240 via a flip-chip process. In this example, optical source 202 may be integrated on an integrated circuit (IC) or substrate and, via flip-chip packing, may be coupled to testing unit 240, which may be integrated on a second IC or substrate. In other example implementations, optical source 202 may be an off-chip laser source, and may otherwise be coupled to testing unit 240 via waveguide 270.

Testing unit 240 may include photodetector 234 for measuring the per-wavelength power of laser light emitted from optical source 202. Testing unit 240 may include a ring resonator 252 to isolate a single wavelength of light from the light emitted by optical module 202. For example, resonator 252 may be tuned to a resonant wavelength corresponding to a wavelength of the multiple wavelengths emitted by optical source 202.

Ring resonator 252 may be coupled (e.g., via evanescent coupling) to waveguide 270. Specifically, ring resonator 252 may receive light as input via waveguide 270 and output light via waveguide 273. When light of the appropriate wavelength is coupled from waveguide 270 to ring resonator 252, constructive interference causes a buildup in intensity over multiple round-trips through the ring resonator. Thereafter, light of the resonant wavelength may propagate across waveguide 273 in the opposite direction to waveguide 270. Accordingly, ring resonator 252 may act as a filter to isolate a specific wavelength of a multi-wavelength optical signal received via waveguide 270.

Photodetector 234 may receive light from output waveguide 273 and may measure the power of any optical signal received. Because waveguide 273 is configured to carry a wavelength of light isolated by ring resonator 252, photodetector 234 may measure a per-wavelength power of the wavelength to which ring resonator 252 is tuned. In an example implementation, photodetector 234 may be configured to communicate readings to controller 210, e.g., via circuit path 274.

Controller 210 may monitor the output optical control signal traversing waveguide 270, and may control the status and/or configuration of optical source 202. Controller 210 may be communicatively and operably coupled to optical source 202 with control logic configured (e.g., programmable and executable) to tune optical source 202 such that an output total power threshold and/or an output per-wavelength power threshold is maintained.

Controller 210 may include a computer readable medium 230 having instructions 232 thereon that, when executed by processor 220, changes the status of optical source 202. Computer readable medium 230 may be implemented in a single device or distributed across devices. Likewise, processor 220 may represent any number of physical processors capable of executing instructions stored by computer readable medium 230.

As used herein, a "computer readable medium" may be any electronic, magnetic, optical, or other physical storage apparatus to contain or store information such as executable instructions, data, and the like. For example, any computer readable medium described herein may be any of RAM, EEPROM, volatile memory, non-volatile memory, flash memory, a storage drive (e.g., an HDD, an SSD), any type of storage disc (e.g., a compact disc, a DVD, etc.), or the like, or a combination thereof. Further, any computer readable medium described herein may be non-transitory. In examples described herein, a computer readable medium or media may be part of an article (or article of manufacture). An article or article of manufacture may refer to any manufactured single component or multiple components.

Processor 220 may be a central processing unit (CPU), graphics processing unit (GPU), microprocessor, and/or other hardware device suitable for retrieval and execution of instructions stored in computer readable medium 230. Processor 220 may fetch, decode, and execute program instructions 232, and/or other instructions. Similarly, processor 220 may fetch, decode, and execute program instructions 232. As an alternative or in addition to retrieving and executing instructions, processor 220 may include at least one electronic circuit comprising a number of electronic components for performing the functionality of instructions 232, and/or other instructions. Similarly, processor 220 may include at least one electronic circuit comprising a number of electronic components for performing the functionality of instructions 232, and/or other instructions.

Instructions 232, when executed, may change the state of optical source 202 when the per-wavelength optical power of the wavelength of light measured by photodetector 234 is above or below a threshold. For example, controller 110, as further described herein, may be electronically coupled to photodetectors 234 such that controller 210 may receive any measurements of photodetector 234. Controller 210 may determine whether the measured per-wavelength optical power is above or below a per-wavelength threshold, and may change the state of optical source 202 when the measured per-wavelength power is above or below the per-wavelength threshold.

In an example implementation, controller 210 may change the state of optical source 202 by increasing or decreasing the bias of optical source 202. In other words, controller 110 may increase or decrease a total power of light emitted by the optical source. Increasing or decreasing the bias of optical source 202 may likewise increase or decrease the per-wavelength power of each respective wavelength emitted by optical source 202. In an example implementation, the bias may be increased or decreased by predetermined intervals responsive to a determination that the total power of light, and/or the per-wavelength power of light is above or below the threshold.

Figure 3:
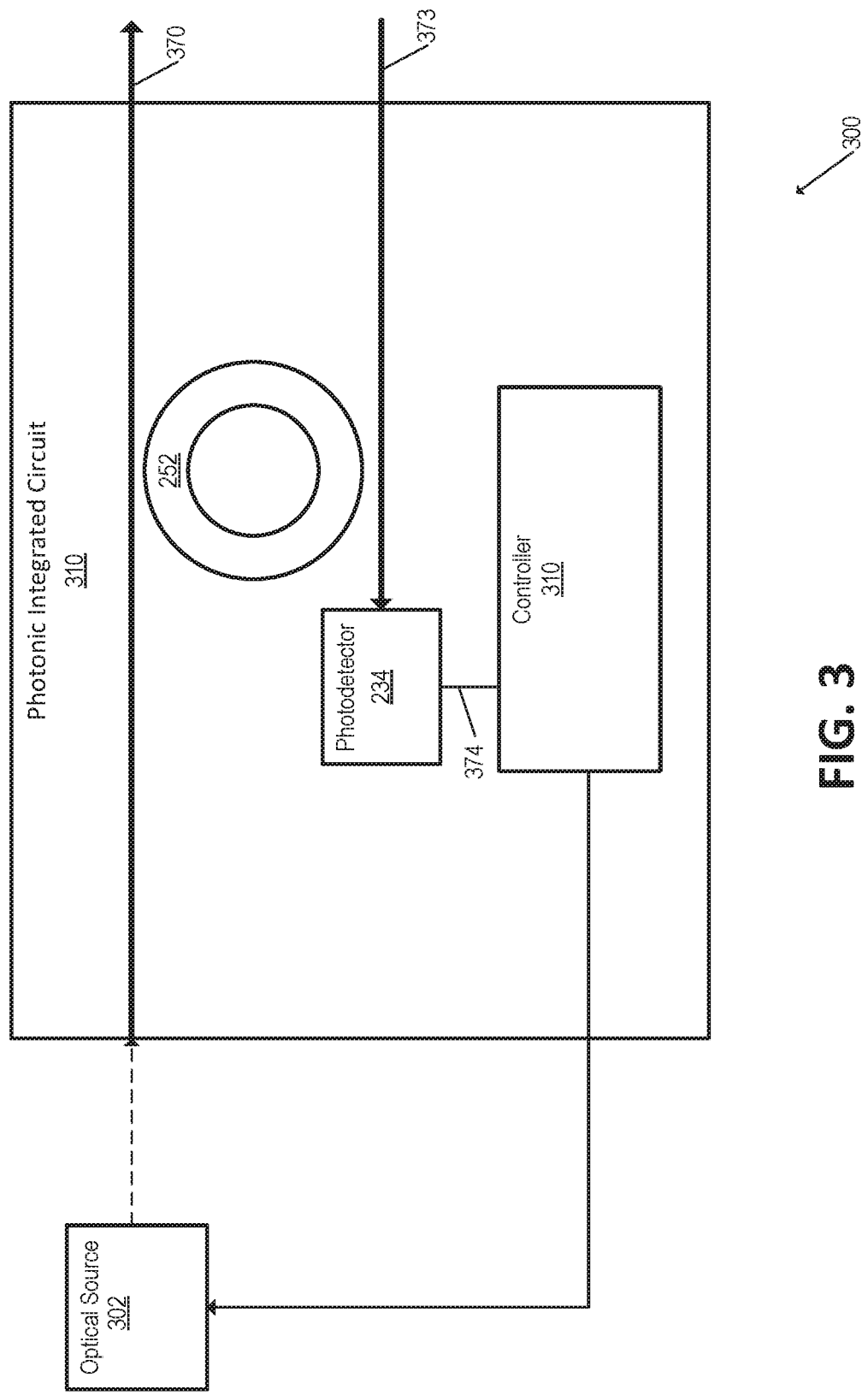
FIG. 3 is a block diagram illustrating a photonic integrated circuit configured for optical source testing.

FIG. 3 is a block diagram 300 of a photonic integrated circuit 310 for optical source testing. Photonic integrated circuit 310 may include similar components to system 201 described above, including ring resonator 252 and photodetector 234. Photonic integrated circuit 310 may be configured to receive light from an optical source 302. The light may be received by photonic integrated circuit 310 and may otherwise traverse photonic integrated circuit 310 via bus waveguide 370.

Ring resonator 252 may be coupled (e.g., via evanescent coupling) to waveguide 370. Ring resonator 252 may act as a filter to isolate a specific wavelength of a multi-wavelength optical signal received via waveguide 270. Specifically, ring resonator 252 may receive light as input via waveguide 370 and output a single wavelength of light via waveguide 373.

Photodetector 234 may receive light from output waveguide 373 and may measure the power of the received optical signal. Because waveguide 373 is configured to carry a wavelength of light isolated by ring resonator 252, photodetector 234 may measure a per-wavelength power of the wavelength to which ring resonator 252 is tuned. In an example implementation, photodetector 234 may be configured to communicate readings to controller 310, e.g., via circuit path 374.

Controller 310 may monitor the optical control signal traversing waveguide 370, and may control the status and/or configuration of optical source 302. Controller 310 may be communicatively and operably coupled to optical source 302 with control logic configured (e.g., programmable and executable) to tune optical source 302 such that the per-wavelength power of the resonant wavelength is maintained within a predetermined range.

Controller 310 may be implemented by one or more engines which may be any combination of hardware and programming to implement the functionalities of the engine(s). In examples described herein, such combinations of hardware and programming may be implemented in a number of different ways. For example, the programming for the engines may be processor executable instructions stored on at least one non-transitory computer readable storage medium and the hardware for the engines may include at least one processing resource to execute those instructions. In some examples, the hardware may also include other electronic circuitry to at least partially implement at least one of the engine(s). In some examples, the at least one computer readable medium may store instructions that, when executed by the at least one processing resource, at least partially implement some or all of the engine(s). In such examples, a computing device may include the at least one computer readable storage medium storing the instructions and the at least one processing resource to execute the instructions. In other examples, the engine may be implemented by electronic circuitry.

Controller 310 may determine whether the measured per-wavelength optical power is within a threshold range, and may change a state of optical source 302 responsive to a positive determination. In an example implementation, controller 310 may change the state of optical source 302 by increasing or decreasing the bias of optical source 302. In other words, controller 310 may increase or decrease a total power of light emitted by the optical source. In an example implementation, the bias may be increased or decreased by predetermined intervals responsive to a determination that the per-wavelength power of light is above or below a threshold.

Figure 4:
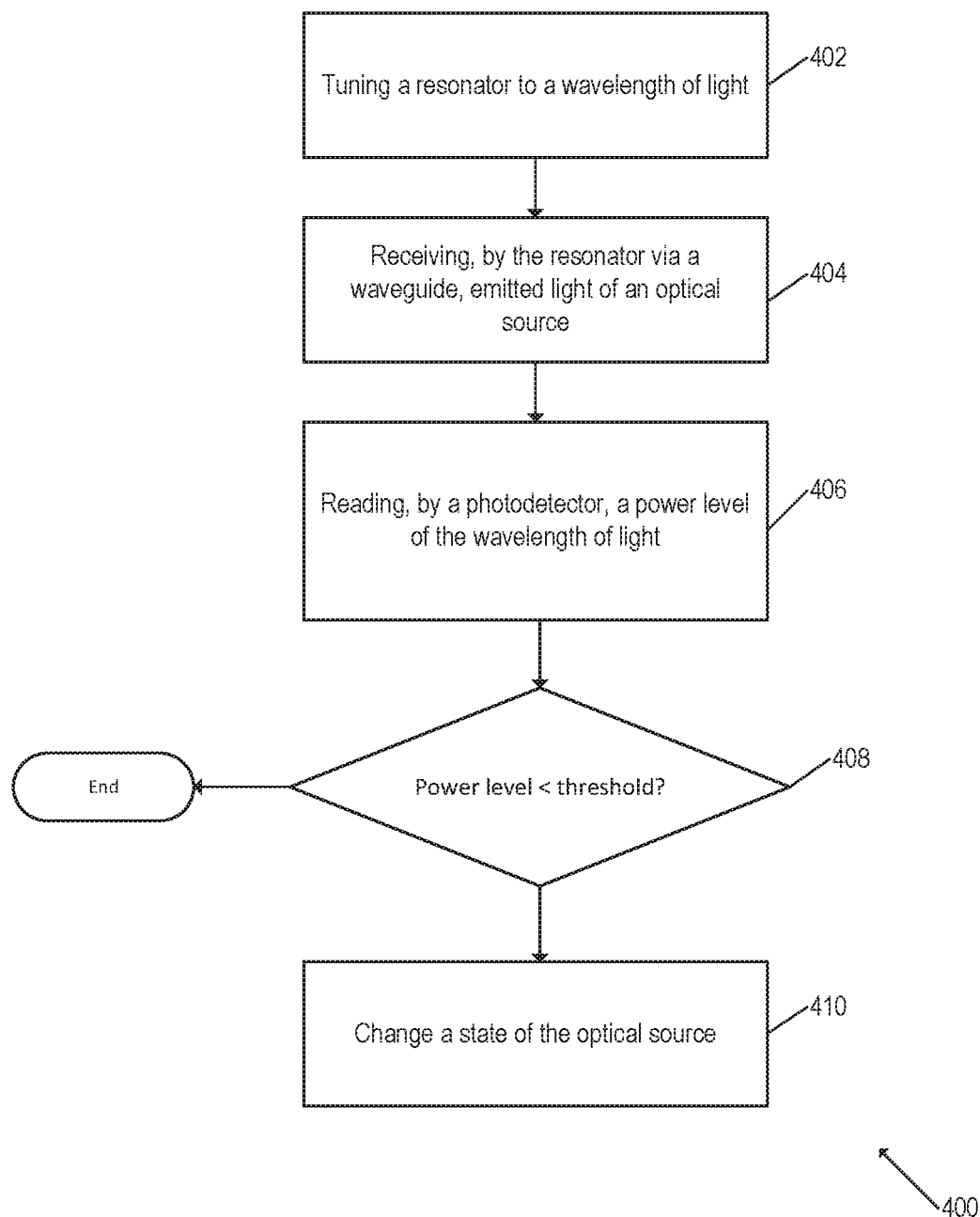
FIG. 4 is a flowchart illustrating a method for changing the status of an optical source.
Figure 5:
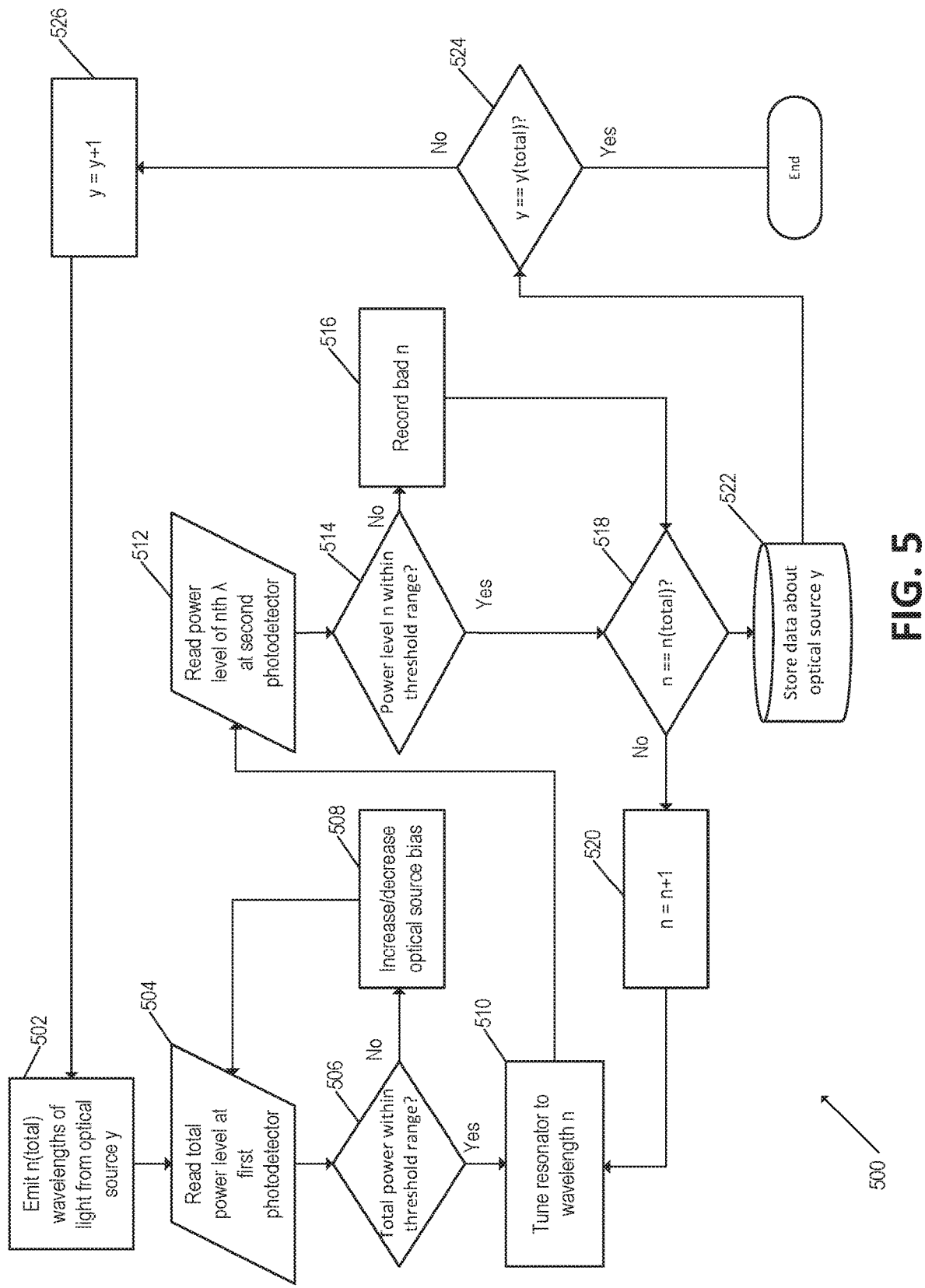
FIG. 5 is a flowchart illustrating a method for determining the per-wavelength power of a multi-wavelength optical source.

FIG. 4 and FIG. 5 are flowcharts illustrating a method 400 and method 500 respectively, for changing the status of an optical source. Although execution of method 400 and method 500 is described below with reference to system 100 of FIG. 1, this is for explanatory purposes and other suitable components for execution of method 400 or method 500 may be utilized. Additionally, the components for executing method 400 or method 500 may spread among multiple devices. Method 400 or method 500 may be implemented in the form of executable instructions stored on a computer readable storage medium and/or in the form of electronic circuitry, e.g. hardware. In some examples, steps of method 400 or method 500 may be executed substantially concurrently or in a different order than shown in FIG. 4 or FIG. 5. In some examples, method 400 or method 500 may include more or less steps than are shown in FIG. 4 or FIG. 5. In some examples, some of the steps of method 400 or method 500 may, at certain times, be ongoing and/or may repeat.

At block 402, a resonator having a resonant wavelength, e.g. resonator 152 of FIG. 1, may be tuned, e.g., via tuner 162, to a wavelength of light corresponding to the resonant wavelength. The wavelength of light to which the resonator is tuned may be a wavelength of light emitted by an optical source, e.g. optical source 102a and/or 102b, emitting a multi-wavelength optical signal.

At block 404, emitted light of the optical source may be received, by the resonator, as an optical signal via a waveguide, e.g. waveguide 170. The resonator may, upon receiving the optical signal, isolate the wavelength of light to which the resonator is tuned. For example, when light of the appropriate wavelength is coupled from the waveguide to the resonator, constructive interference causes a buildup in intensity over multiple round-trips through the resonator. Thereafter, light of the resonant wavelength may propagate across a parallel waveguide, e.g. waveguide 173. In this way, the resonator may act as a filter to isolate a specific wavelength of a multi-wavelength optical signal.

At block 406, a power level of the isolated wavelength of light may be measured. For example, photodetector 134 may receive light from output waveguide 173 and may measure the power of any optical signal received. At block 408, it may be determined whether the measured power level is below a first per-wavelength threshold. In an example implementation, photodetector 134 may be configured to communicate readings to controller 110, e.g., via circuit path 174.

At block 408, it may be determined whether the power level of the measured wavelength of light is above a per-wavelength threshold. At block 410, a state of the optical source may be changed when the power level of the measured wavelength of light is below the per-wavelength threshold. For example, controller 110 may determine whether the measured optical power is below a per-wavelength power threshold, and may change the state of an optical source of optical module 101 responsive to the measured optical power being below the per-wavelength power threshold.

In an example implementation, the controller may change the state of an optical source by increasing the bias of the optical source. In another example, the controller may change the state of the optical source by inactivating the optical source. For example, optical source 102a may be in an active state and optical source 102b may be in an inactive state such that optical source 102a, and not optical source 102b, may be emitting a multi-wavelength optical signal across waveguide 170. Controller 110 may inactivate optical source 102a and activate backup optical source 102b, responsive to a determination that a per-wavelength power of light emitted by optical source 102a is below a threshold. Accordingly, the per-wavelength power of a multi-wavelength optical signal emitted by an optical source may be monitored and otherwise controlled.

Turning to FIG. 5, n(total) different wavelengths of light may be emitted from an optical source y at block 502. For example, optical source 102a or optical source 102b of FIG. 1 may emit a multi-wavelength optical signal to be carried by bus waveguide 170. At block 504, a total power level of the emitted optical signal may be read by a total power photodetector, e.g. photodetector 134 of FIG. 1.

It may be determined at block 506 whether the total power measured by the total power photodetector is within a threshold range, i.e. above or below a threshold. At block 508, the optical source bias may be increased or decreased when it is determined that the measured total power is not within the threshold range. For example, controller 110 may increase the bias of optical source 102a or optical source 102b responsive to a determination that the total power emitted by optical module 101 is below a threshold. Controller 110 may similarly decrease the bias of optical source 102a or optical source 102b responsive to a determination that the total power emitted by optical module 101 is above a threshold. The increase or decrease of the optical source bias may be followed by a return to block 504.

At block 510, a resonator may be tuned to a wavelength of n, when $n_1$ is a first discrete wavelength of light emitted by the optical source, $n_2$ is a second discrete wavelength of light emitted by the optical source, etc. Specifically, the resonator may be tuned to have a resonance frequency that matches the wavelength of n. For example, resonator 152 may be tuned by tuner 162 to the wavelength of n.

At block 512, a power level of the $n^{th}$ wavelength of light may be read. For example, photodetector 134 of FIG. 1 may measure a wavelength of light emitted by optical source 102a or 102b and otherwise isolated by a resonator of the set of resonators 150.

At block 514, it may be determined whether the power level of n is within a threshold range. A negative determination is followed by a recording of a bad wavelength n at block 516. For example, controller 110 of FIG. 1 may determine that the power level of the wavelength of light measured by photodetector 134 is not within a threshold range, and may store the determination at storage 112.

It may be determined at block 518 whether each wavelength of light emitted from the optical source has been measured, or otherwise whether a predetermined number of wavelengths of light emitted by the optical source have been measured. A negative determination is followed by incrementing n at block 520 such that the next wavelength of light emitted from the optical source may be measured, followed by a return to block 510. After it is determined that each wavelength of light emitted has been measured (and each bad wavelength recorded), the measurements of the optical source may be recorded at block 522. For example, controller 110 of FIG. 1 may record the measurements at storage 112, and, depending on the results of the measurements, may change the state of the optical source as described above.

At block 524, it may be determined whether each optical source has been evaluated. A negative determination is followed by incrementing the optical source y at block 526 such that a next optical source may be evaluated. For example, a next optical source of optical module 101, e.g. optical source 102b, may be evaluated after evaluating a first optical source, e.g. optical source 102a. Accordingly, the "health" of each optical source of an optical module may be evaluated by determining the per-wavelength power and total power of light emitted by each optical source.

In the foregoing description, numerous details are set forth to provide an understanding of the subject disclosed herein. However, implementations can be practiced without some or all of these details. Other implementations can include additions, modifications, or variations from the details discussed above. It is intended that the appended claims cover such modifications and variations. The specification and drawings are, accordingly, to be regarded as illustrative rather than restrictive.

It will be recognized that the terms "comprising," "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect (e.g., having additional intervening components or elements), between two or more elements, nodes, or components; the coupling or connection between the elements can be physical, mechanical, logical, optical, electrical, or a combination thereof.

In the Figures, identical reference numbers identify identical, or at least generally similar, elements. To facilitate the discussion of any particular element, the most significant digit or digits of any reference number refers to the Figure in which that element is first introduced. For example, ring resonator 252 is first introduced and discussed with reference to FIG. 2.

The invention claimed is:

1. An optical system comprising:
   an optical source configured to emit light having different wavelengths;
      a waveguide configured to couple the emitted light from the optical source to a testing unit;
   the testing unit, the testing unit including:
      a resonator coupled to the waveguide and having a resonant wavelength, the resonator to filter a first wavelength of the light emitted by the optical source corresponding to the resonant wavelength;
      a first photodetector coupled to the resonator to receive the first wavelength and measure a first power of the resonant wavelength; and
   a controller coupled to the optical source, the controller to receive the measured first power of the first wavelength and change a state of the optical source when the measured first power of the first wavelength is below a per-wavelength threshold,
   wherein changing the state of the optical source includes inactivating the optical source and activating a redundant optical source coupled to the waveguide.

2. The optical system of claim 1, wherein the optical source comprises an on- or off-chip multi-wavelength comb laser.

3. The optical system of claim 1, further comprising:
   an optical tap to,
      receive the light emitted by the optical source; and
      extract at least a portion of the light emitted by the optical source; and
   a second photodetector to,
      receive the light extracted by the optical tap; and
      measure a total power of the light emitted by the optical source.

4. The optical system of claim 3, wherein the light extracted by the optical tap is between 1% to 10% of the total light emitted by the optical source.

5. The optical system of claim 3, wherein the controller further receives the total power measurement and changes the state of the optical source when the measured total power is below a total threshold.

6. The optical system of claim 1, wherein changing the state of the optical source includes increasing a total power of light emitted by the optical source.

7. The optical system of claim 1, further comprising a tuner, the tuner to tune the resonator to the resonant wavelength.

8. The optical system of claim 7, wherein the tuner is at least one of a heater, an injection diode, and a metal-oxide-semiconductor (MOS) capacitor.

9. The optical system of claim 1, wherein the resonator is one of a first set of resonators coupled to the waveguide, each resonator having a resonant wavelength corresponding to a different wavelength of the emitted light from the optical source, and wherein each resonator is configured to be tuned to a single wavelength of the emitted light different from the other resonators of the first set of resonators.

10. A method comprising:
   tuning a resonator having a resonant wavelength to a first wavelength of light corresponding to the resonant wavelength, wherein the first wavelength is emitted by an optical source configured to emit light having different wavelengths;
   receiving, by the resonator, the emitted light of the optical source via a waveguide, the resonator to isolate the first wavelength of light;
   reading, by a first photodetector coupled to the resonator, a first power level of the first wavelength of light;
   determining whether the power level of the first wavelength of light is below a first per-wavelength threshold;
   changing the state of the optical source when the power level of the first wavelength of light is below the first per-wavelength threshold;
   reading, by a second photodetector coupled to the waveguide, a total power level of the optical source, the total power level including a summation of each different wavelength of lights' power level; and
   inactivating the optical source and activating a redundant optical source coupled to the waveguide when the total power level is below a total power threshold.

11. The method of claim 10, further comprising:
   reading, by a second photodetector coupled to the waveguide, a total power level of the optical source, the total power level including a summation of each different wavelengths' power level; and
   increasing a bias of the optical source when the total power level is below a total power threshold.

12. The method of claim 10, further comprising:
   re-tuning the resonator to isolate a second wavelength of light emitted by the optical source;
   reading, by the first photodetector, a second power level of the second wavelength of light;
   determining whether the second power level of the second wavelength of light is below a second per-wavelength threshold; and
   changing the state of the optical source when the power level of the wavelength of light is below the second per-wavelength threshold.

13. The method of claim 10, further comprising storing the determined power level of the wavelength of light in memory.

14. A photonic integrated circuit comprising:
- a resonator tuned to filter a resonant wavelength of light emitted by an optical source, wherein the optical source is configured to emit light having different wavelengths, and the resonator is configured to receive light emitted by the optical source;
- a first photodetector to receive the light emitted by the optical source, the light including the resonant wavelength, and measure a first power of the resonant wavelength; and
- a controller coupled to the optical source, the controller to receive the measured first power of the resonant wavelength and change a state of the optical source when the measured first power of the resonant wavelength is below a per-wavelength threshold;
- wherein changing the state of the optical source includes inactivating the optical source and activating a redundant optical source coupled to the waveguide.

15. The photonic integrated circuit of claim 14, further comprising:
- an optical tap to,
  - receive the light emitted by the optical source; and
  - extract at least some of the light emitted by the optical source; and
- a second photodetector to,
  - receive the light extracted by the optical tap; and
  - measure a total power of the light emitted by the optical source.

16. The photonic integrated circuit of claim 15, wherein the resonator is a ring resonator.

17. The photonic integrated circuit of claim 14, wherein the photonic integrated circuit is flip-chip packaged to the optical source.

18. The photonic integrated circuit of claim 14, wherein the photonic integrated circuit receives the light emitted by the optical source via a waveguide coupled to the optical source and the photonic integrated circuit.

* * * * *